United States Patent
Nirschl et al.

(10) Patent No.: US 7,786,464 B2
(45) Date of Patent: Aug. 31, 2010

(54) INTEGRATED CIRCUIT HAVING DIELECTRIC LAYER INCLUDING NANOCRYSTALS

(75) Inventors: Thomas Nirschl, Munich (DE); Ronald Kakoschke, München (DE)

(73) Assignee: Infineon Technologies AG, Neubiberg (DE)

( * ) Notice: Subject to any disclaimer, the term of this patent is extended or adjusted under 35 U.S.C. 154(b) by 181 days.

(21) Appl. No.: 11/943,154

(22) Filed: Nov. 20, 2007

(65) Prior Publication Data

US 2009/0127536 A1 May 21, 2009

(51) Int. Cl.
*H01L 47/00* (2006.01)

(52) U.S. Cl. ............ 257/3; 257/4; 257/5; 257/E29.105; 365/148

(58) Field of Classification Search .................. None
See application file for complete search history.

(56) References Cited

U.S. PATENT DOCUMENTS

| | | | |
|---|---|---|---|
| 6,329,666 B1 * | 12/2001 | Doan et al. ............... | 257/3 |
| 2003/0103406 A1 * | 6/2003 | Tran ...................... | 365/230.06 |
| 2005/0158950 A1 | 7/2005 | Scheuerlein et al. | |
| 2005/0173691 A1 | 8/2005 | Lee et al. | |
| 2007/0018342 A1 * | 1/2007 | Sandhu et al. ........ | 257/E29.071 |

OTHER PUBLICATIONS

"Chemical Vapor Deposition of Ge nanocrystals on SiO2", T. Baron, et al., 2003 American Institute of Physics. (3 pgs.).
"Highly Reliable 50nm Contact Cell Technology for 256Mb PRAM", S.J. Ahn, et al., 2005 Symposium on VLSI Technology Digest of Technical Papers. (2 pgs.).
"How Far will Silicon Nanocrystals Push the Scaling Limits of NVMs Technologies?", B. De Salvo, et al., 2003 IEEE (4 pgs.).
"Influence of the Chemical Properties of the Substrate on Silicon Quantum Dot Nucleation", F. Mazen, et al., Journal of the Electrochemical Society, 2003. (6 pgs.).
"Microstructure and Electrical Properties of Ge- and Si-Nanoclusters in Implanted Gate Oxide for Embedded Memory Applications", K. H. Stegemann, et al. (7 pgs.).
"Novel One-Mask Self-heating Pillar Phase Change Memory", T. D. Happ, et al., 2006 Symposium on VLSI Technology Digest of Technical Papers. (2 pgs.).

\* cited by examiner

*Primary Examiner*—Evan Pert
*Assistant Examiner*—Scott R Wilson
(74) *Attorney, Agent, or Firm*—Dicke, Billig & Czaja, PLLC

(57) ABSTRACT

An integrated circuit includes a first electrode, resistivity changing material coupled to the first electrode, and a second electrode. The integrated circuit includes a dielectric material layer between the resistivity changing material and the second electrode. The dielectric material layer includes nanocrystals.

23 Claims, 9 Drawing Sheets

INTEGRATED CIRCUIT HAVING DIELECTRIC LAYER INCLUDING NANOCRYSTALS

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

A typical phase change memory cell includes phase change material between two electrodes. The interface area between the phase change material and at least one of the electrodes determines the power used to program the memory cell. As the interface area between the phase change material and the at least one electrode is reduced, the current density through the phase change material is increased. The higher the current density through the phase change material, the lower the power used to program the phase change material.

For these and other reasons, there is a need for the present invention.

SUMMARY

One embodiment provides an integrated circuit. The integrated circuit includes a first electrode, resistivity changing material coupled to the first electrode, and a second electrode. The integrated circuit includes a dielectric material layer between the resistivity changing material and the second electrode. The dielectric material layer includes nanocrystals.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
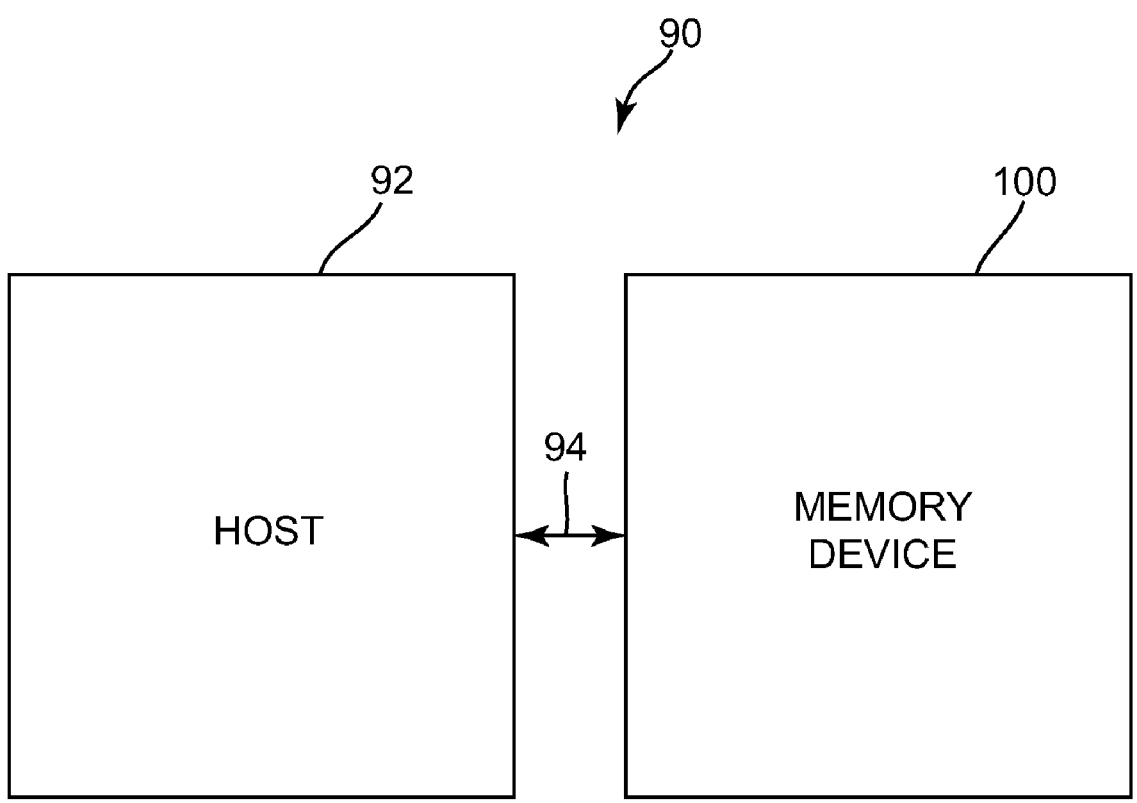
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player), or any other suitable device that uses memory. Memory device 100 provides memory for host 92. In one embodiment, memory device 100 includes a phase change memory device or other suitable resistive or resistivity changing memory device.

Figure 2:
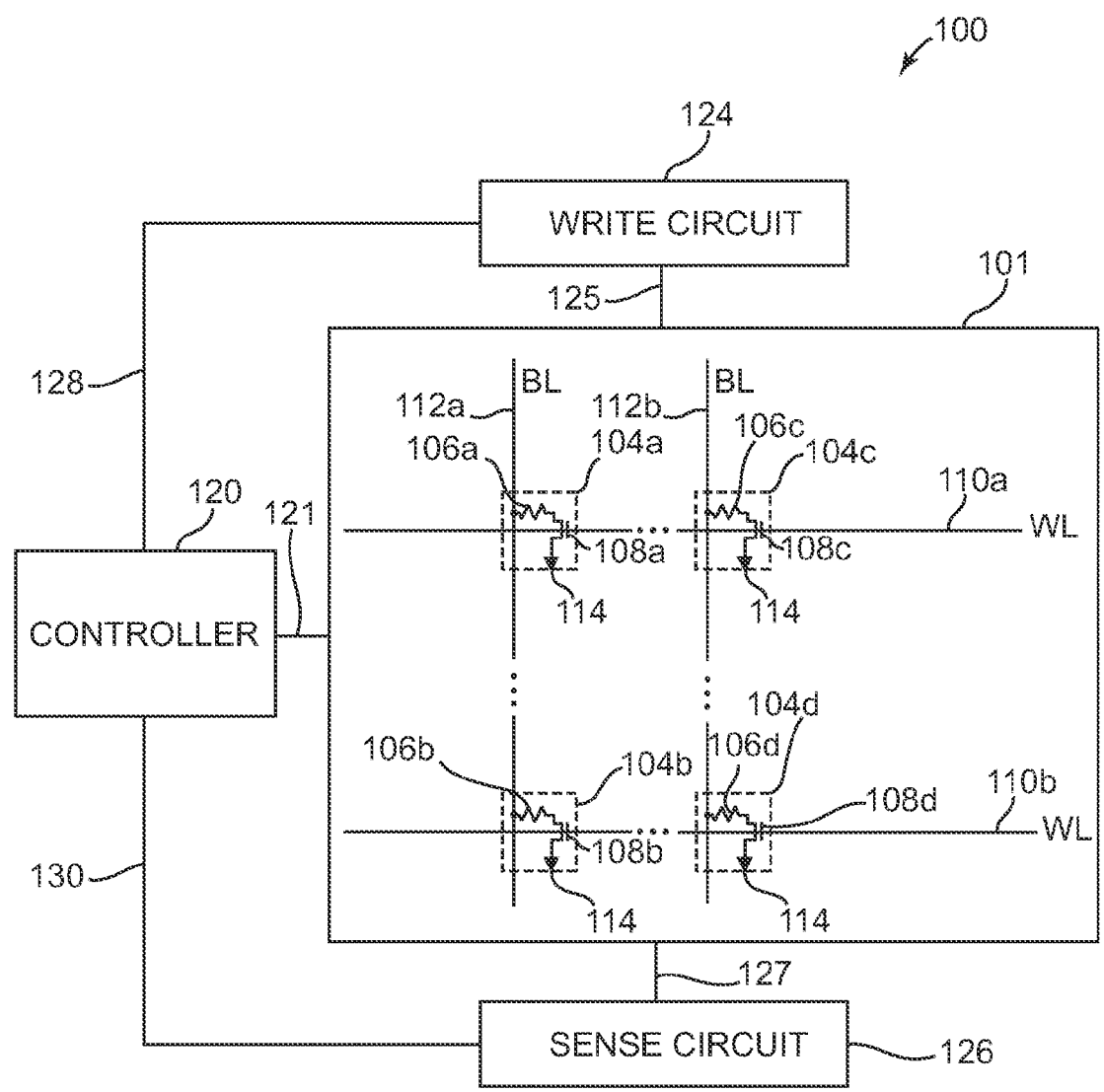
FIG. 2 is a diagram illustrating one embodiment of a memory device.

FIG. 2 is a diagram illustrating one embodiment of memory device 100. Memory device 100 includes write circuit 124, controller 120, memory array 101, and sense circuit 126. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110).

Each phase change memory cell 104 includes a dielectric material layer including nanocrystals. The dielectric material layer is between phase change material and an electrode. The nanocrystals ensure reproducibility of dielectric breakdown through the dielectric material layer. The dielectric breakdown defines an interface area between the electrode and the phase change material. By reducing the interface area between the phase change material and the electrode via the dielectric breakdown, the current density through the phase change material is increased. With the increased current density, less power is used to program the phase change material.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode-like structure may be used in place of transistor 108. Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states can be three states and a ternary system can be used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory circuit 100. Controller 120 controls read and write operations of memory circuit 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In one embodiment, sense circuit 126 provides voltage across one of the memory cells 104 and reads the current that flows through that one of the memory cells 104. In one embodiment, write circuit 124 provides voltage across one of the memory cells 104 and sense circuit 126 reads the current that flows through that one of the memory cells 104. In one embodiment, write circuit 124 provides current that flows through one of the memory cells 104 and sense circuit 126 reads the voltage across that one of the memory cells 104.

During a set operation of phase change memory cell 104a, one or more set current or voltage pulses are selectively enabled by write circuit 124 and sent through bit line 112a to phase change element 106a thereby heating phase change element 106a above its crystallization temperature (but usually below its melting temperature) with word line 110a selected to activate transistor 108a. In this way, phase change element 106a reaches its crystalline state or a partially crystalline and partially amorphous state during this set operation.

During a reset operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state. Phase change memory cells 104b-104d and other phase change memory cells 104 in memory array 100 are set and reset similarly to phase change memory cell 104a using a similar current or voltage pulse.

Figure 3A:
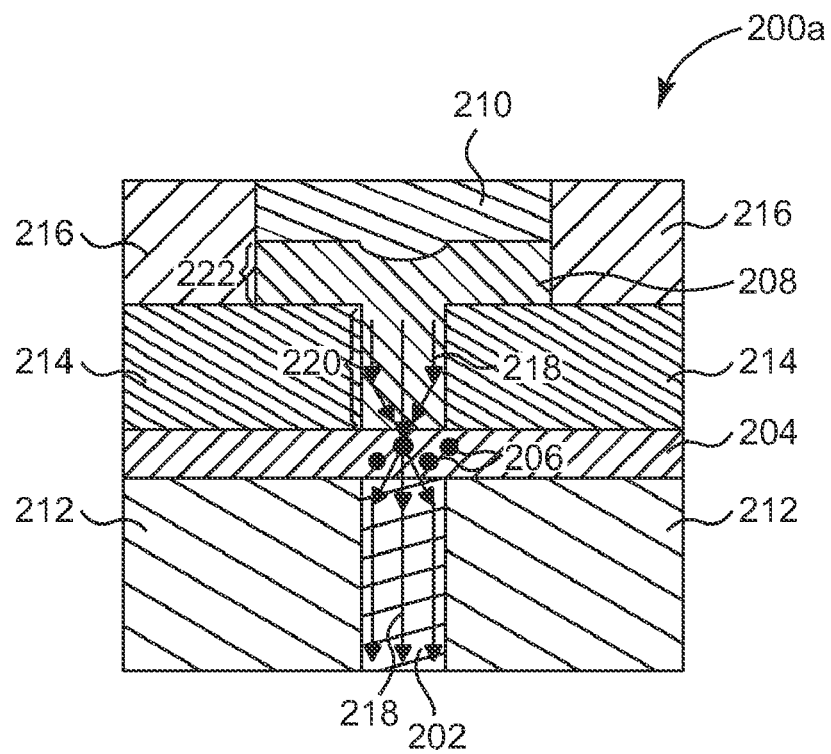
FIG. 3A illustrates a cross-sectional view of one embodiment of a phase change element.

FIG. 3A illustrates a cross-sectional view of one embodiment of a phase change element 200a. In one embodiment, each phase change element 106 is similar to phase change element 200a. In one embodiment, phase change element 200a is a via phase change element. Phase change element 200a includes a bottom electrode 202, a dielectric material layer 204 including nanocrystals 206, phase change material 208, a top electrode 210, and dielectric material 212, 214, and 216. Phase change material 208 includes a first portion 220 and a second portion 222. First portion 220 has a smaller cross-sectional width than second portion 222.

Bottom electrode 202 includes TiN, TaN, W, Al, Ti, Ta, TiSiN, TaSiN, TiAlN, TaAlN, Cu, WN, C, or other suitable electrode material. Bottom electrode 202 is laterally surrounded by dielectric material 212. Dielectric material 212 includes $SiO_2$, $SiO_x$, SiN, fluorinated silica glass (FSG), boro-phosphorous silicate glass (BPSG), boro-silicate glass (BSG), or other suitable dielectric material. The top of bottom electrode 202 and the top of dielectric material 212 contact the bottom of dielectric material layer 204 including nanocrystals 206.

Nanocrystals 206 are located within dielectric material layer 204 above bottom electrode 202. Dielectric material layer 204 includes $SiO_2$, $SiO_x$, or other suitable dielectric material. Nanocrystals 206 include Si, Ge, or other suitable nanocrystals. In one embodiment, dielectric material layer 204 has a thickness within a range of approximately 3-4 nanometers. In another embodiment, dielectric material layer 204 has a thickness within a range of approximately 3-15 nanometers. In one embodiment, nanocrystals 206 are grown in dielectric material layer 204 using a nanocrystal growth process. In another embodiment, nanocrystals 206 are implanted into dielectric material layer 204 using an ion implantation process. The top of dielectric material layer 204 contacts the bottom of first portion 220 of phase change material 208 and the bottom of dielectric material 214.

Phase change material 208 provides a storage location for storing one or more bits of data. The active or phase change region in phase change material 208 is at the interface between phase change material 208 and dielectric material layer 204 where nanocrystals 206 are present. Dielectric material 214 laterally surrounds first portion 220 of phase change material 208. Dielectric material 214 includes $SiO_2$, $SiO_x$, SiN, FSG, BPSG, BSG, or other suitable dielectric material. The top of dielectric material 214 contacts the bottom of second portion 222 of phase change material 208 and the bottom of dielectric material 216.

The top of second portion 222 of phase change material 208 contacts the bottom of top electrode 210. Top electrode 210 includes TiN, TaN, W, Al, Ti, Ta, TiSiN, TaSiN, TiAlN, Cu, WN, C, or other suitable electrode material. The second portion 222 of phase change material 208 and top electrode 210 are laterally surrounded by dielectric material 216. Dielectric material 216 includes $SiO_2$, $SiO_x$, SiN, FSG, BPSG, BSG, or other suitable dielectric material.

The current path through memory element 200a is from top electrode 210 through phase change material 208 and dielectric material layer 204, including at least one nanocrystal 206, to bottom electrode 202 as indicated at 218. In another embodiment, the current path is reversed. The interface area between phase change material 208 and dielectric material layer 204 is defined by dielectric breakdown. Nanocrystals 206 ensure the reproducibility of the dielectric breakdown within dielectric material layer 204. Nanocrystals 206 define predetermined breaking points within dielectric material layer 204 in the nanometer range. The dielectric breakdown between bottom electrode 202 and phase change material 208 occurs via a nanocrystal, thereby confining the programming current. By reducing the interface area, the current density is increased, thus reducing the power used to program phase change element 200a.

During operation, current or voltage pulses are applied between top electrode 210 and bottom electrode 202 to program phase change element 200a. During a set operation of phase change element 200a, a set current or voltage pulse is selectively enabled by write circuit 124 and sent through a bit line to top electrode 210. From top electrode 210, the set current or voltage pulse passes through phase change material 208 thereby heating the phase change material above its crystallization temperature (but usually below its melting temperature). In this way, the phase change material reaches a crystalline state or a partially crystalline and partially amorphous state during the set operation.

During a reset operation of phase change element 200a, a reset current or voltage pulse is selectively enabled by write circuit 124 and sent through a bit line to top electrode 210. From top electrode 210, the reset current or voltage pulse passes through phase change material 208. The reset current or voltage quickly heats the phase change material above its melting temperature. After the current or voltage pulse is turned off, the phase change material quickly quench cools into an amorphous state or a partially amorphous and partially crystalline state.

Figure 3B:
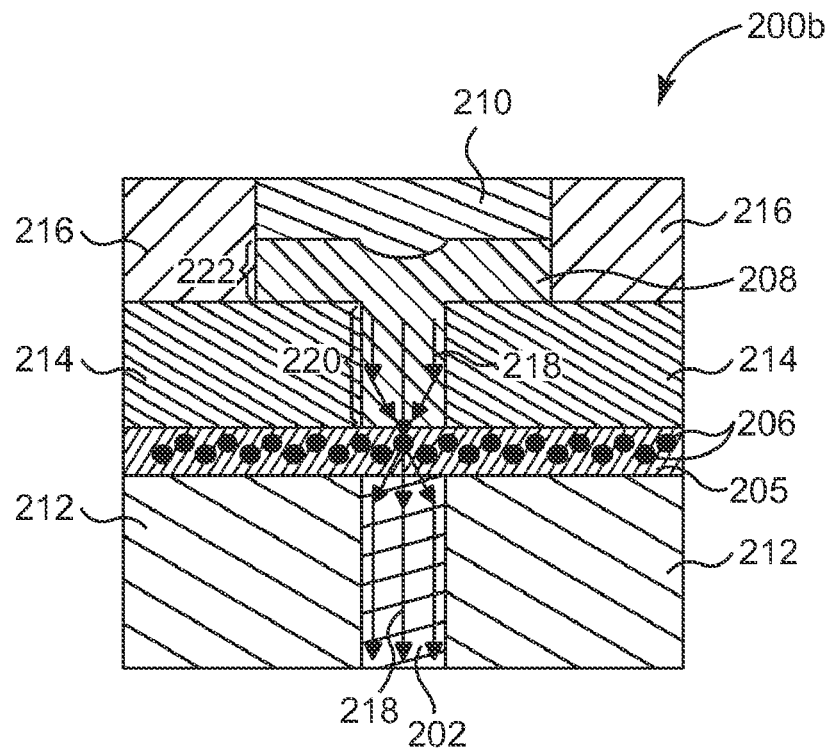
FIG. 3B illustrates a cross-sectional view of another embodiment of a phase change element.

FIG. 3B illustrates a cross-sectional view of another embodiment of a phase change element 200b. In one embodiment, each phase change element 106 is similar to phase change element 200b. Phase change element 200b is similar to phase change element 200a previously described and illustrated with reference to FIG. 3A, except that in phase change element 200b, nanocrystals 206 are distributed throughout a dielectric material layer 205.

In this embodiment, the top of bottom electrode 202 and the top of dielectric material 212 contact the bottom of dielectric material layer 205 including nanocrystals 206. Nanocrystals 206 are located throughout dielectric material layer 205. Dielectric material layer 205 includes $SiO_2$, $SiO_x$, or other suitable dielectric material. Nanocrystals 206 include Si, Ge, or other suitable nanocrystals. In one embodiment, dielectric material layer 205 has a thickness within a range of approximately 3-4 nanometers. In another embodiment, dielectric material layer 205 has a thickness within a range of approximately 3-15 nanometers. In one embodiment, nanocrystals 206 are grown in dielectric material layer 205 using a nanocrystal growth process. In another embodiment, nanocrystals 206 are implanted into dielectric material layer 205 using an ion implantation process. The top of dielectric material layer 205 contacts the bottom of first portion 220 of phase change material 208 and the bottom of dielectric material 214. Phase change element 200b is programmed similarly to phase change element 200a previously described and illustrated with reference to FIG. 3A.

Figure 3C:
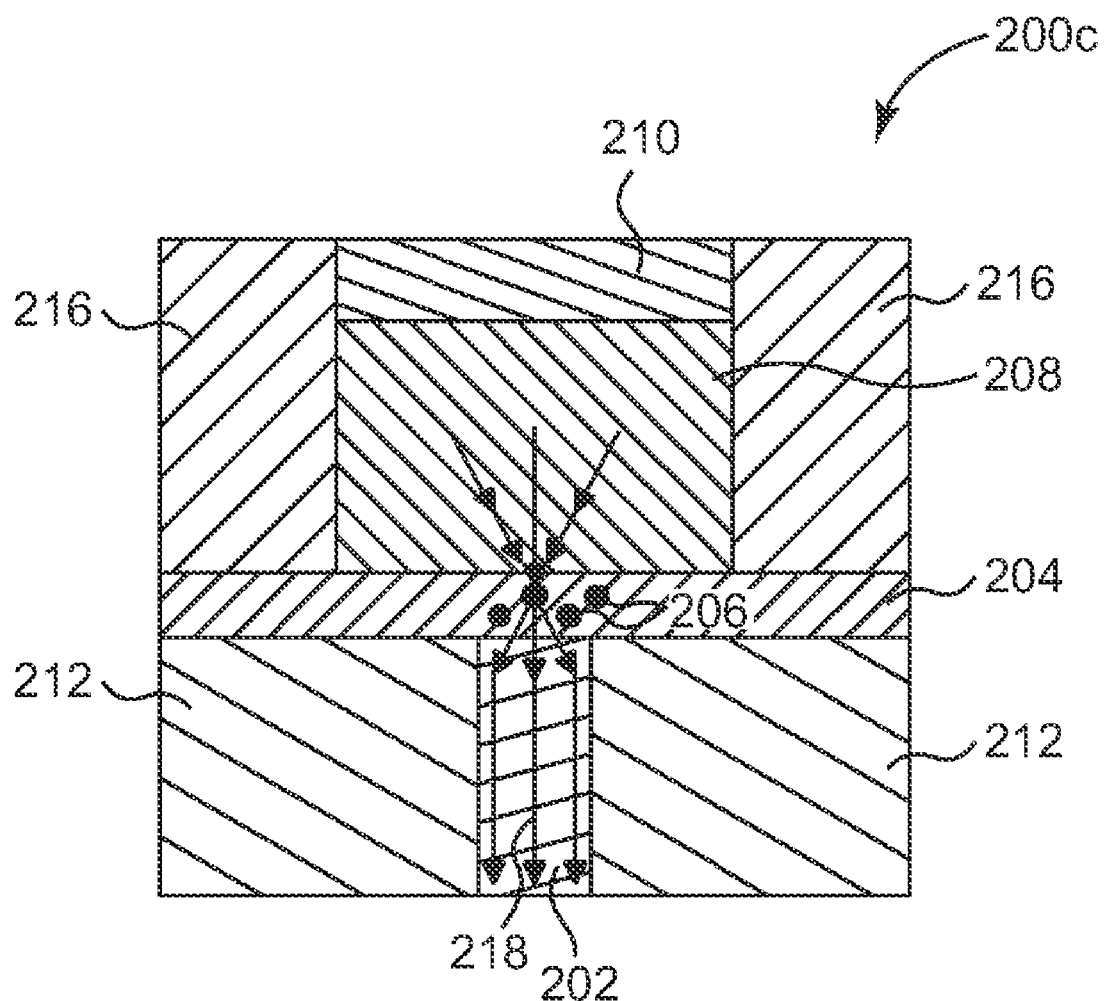
FIG. 3C illustrates a cross-sectional view of another embodiment of a phase change element.

FIG. 3C illustrates a cross-sectional view of another embodiment of a phase change element 200c. In one embodiment, each phase change element 106 is similar to phase change element 200c. In one embodiment, phase change element 200c is a mushroom phase change element. Phase change element 200c is similar to phase change element 200a previously described and illustrated with reference to FIG. 3A, except that in phase change element 200c, the cross-sectional width of phase change material 208 is greater than the cross-sectional width of the portion of dielectric material layer 204 that includes nanocrystals 206 and dielectric material 214 is removed. The top of dielectric material layer 204 contacts the bottom of phase change material 208 and the bottom of dielectric material 216. Phase change element 200c is programmed similarly to phase change element 200a previously described and illustrated with reference to FIG. 3A.

The following FIGS. 4-10 illustrate embodiments for fabricating a phase change element, such as phase change element 200a previously described and illustrated with reference to FIG. 3A.

Figure 4:
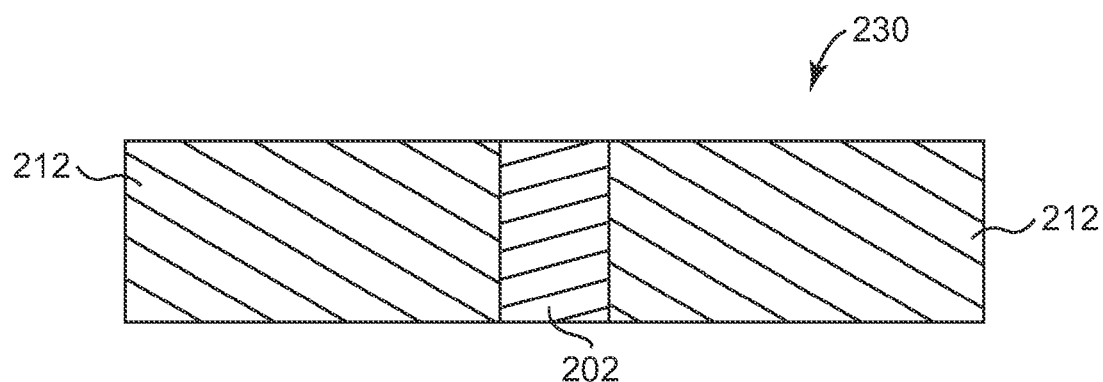
FIG. 4 illustrates a cross-sectional view of one embodiment of a preprocessed wafer.

FIG. 4 illustrates a cross-sectional view of one embodiment of a preprocessed wafer 230. Preprocessed wafer 230 includes bottom electrode 202, dielectric material 212, and lower wafer layers (not shown). In one embodiment, the lower wafer layers include access devices, such as transistors or diodes, where each transistor or diode is coupled to a bottom electrode 202. Bottom electrode 202 includes TiN, TaN, W, Al, Ti, Ta, TiSiN, TaSiN, TiAlN, TaAlN, Cu, WN, C, or other suitable electrode material. Bottom electrode 202 is laterally surrounded by dielectric material 212. Dielectric material 212 includes $SiO_2$, $SiO_x$, SiN, FSG, BPSG, BSG, or other suitable dielectric material.

Figure 5:
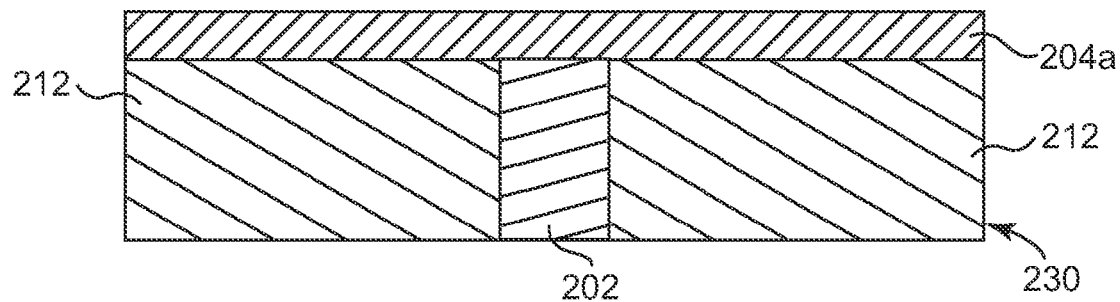
FIG. 5 illustrates a cross-sectional view of one embodiment of the preprocessed wafer and a first dielectric material layer.

FIG. 5 illustrates a cross-sectional view of one embodiment of preprocessed wafer 230 and a first dielectric material layer 204a. A dielectric material, such as $SiO_2$, $SiO_x$, or other suitable dielectric material is deposited over preprocessed wafer 230 to provide first dielectric material layer 204a. First dielectric material layer 204 is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique. In one embodiment, first dielectric material layer 204a is deposited to a thickness of between approximately 3-4 nanometers. In another embodiment, first dielectric material layer 204a is deposited to a thickness of between approximately 3-15 nanometers.

Figure 6:
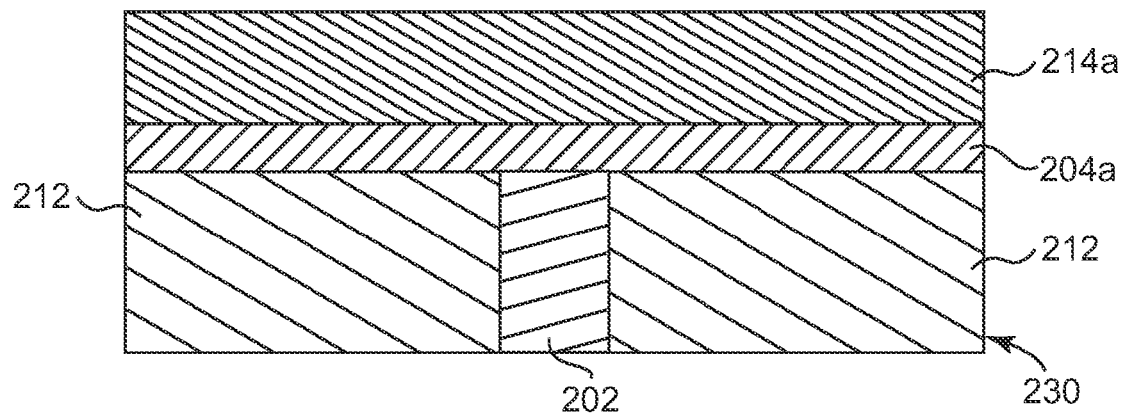
FIG. 6 illustrates a cross-sectional view of one embodiment of the preprocessed wafer, the first dielectric material layer, and a second dielectric material layer.

FIG. 6 illustrates a cross-sectional view of one embodiment of preprocessed wafer 230, first dielectric material layer 204a, and a second dielectric material layer 214a. A dielectric material, such as $SiO_2$, $SiO_x$, SiN, FSG, BPSG, BSG, or other suitable dielectric material is deposited over first dielectric material layer 204a to provide second dielectric material layer 214a. Second dielectric material layer 214a is deposited using CVD, HDP-CVD, ALD, MOCVD, PVD, JVD, or other suitable deposition technique. In one embodiment, second dielectric material layer 214a is deposited to a thickness greater than the thickness of first dielectric material layer 204a.

Figure 7:
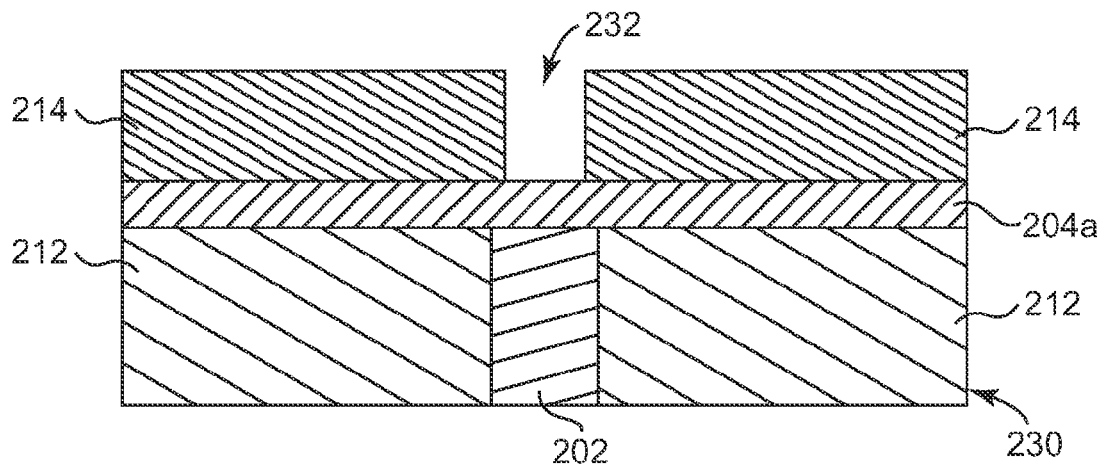
FIG. 7 illustrates a cross-sectional view of one embodiment of the preprocessed wafer, the first dielectric material layer, and the second dielectric material layer after etching the second dielectric material layer.

FIG. 7 illustrates a cross-sectional view of one embodiment of preprocessed wafer 230, first dielectric material layer 204a, and second dielectric material layer 214 after etching second dielectric material layer 214a. Second dielectric material layer 214a is etched to provide opening 232 exposing a portion of first dielectric material layer 204a. In one embodiment, opening 232 is substantially centered above bottom electrode 202.

Figure 8:
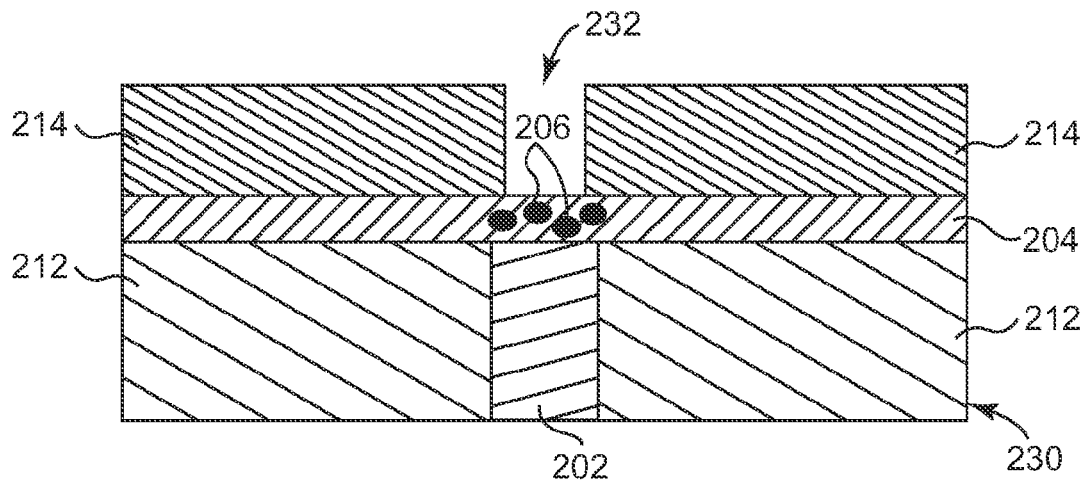
FIG. 8 illustrates a cross-sectional view of one embodiment of the preprocessed wafer, the first dielectric material layer, and the second dielectric material layer after forming nanocrystals in the first dielectric material layer.

FIG. 8 illustrates a cross-sectional view of one embodiment of preprocessed wafer 230, first dielectric material layer 204, and second dielectric material layer 214 after forming nanocrystals 206 in first dielectric material layer 204a. In one embodiment, nanocrystals 206, such as Si, Ge, or other suitable nanocrystals are grown in exposed portions of first dielectric material layer 204a. In another embodiment, nanocrystals 206, such as Si+, Ge+, or other suitable nanocrystals are implanted into exposed portions of first dielectric material layer 204a. In one embodiment, the nanocrystals are implanted at an energy between approximately 1-20 keV, at a dose between approximately $10^{15}$-$10^{16}$ cm$^{-2}$, and followed by rapid thermal processing (RTP) at approximately 950° C. for approximately 30 s.

Figure 9:
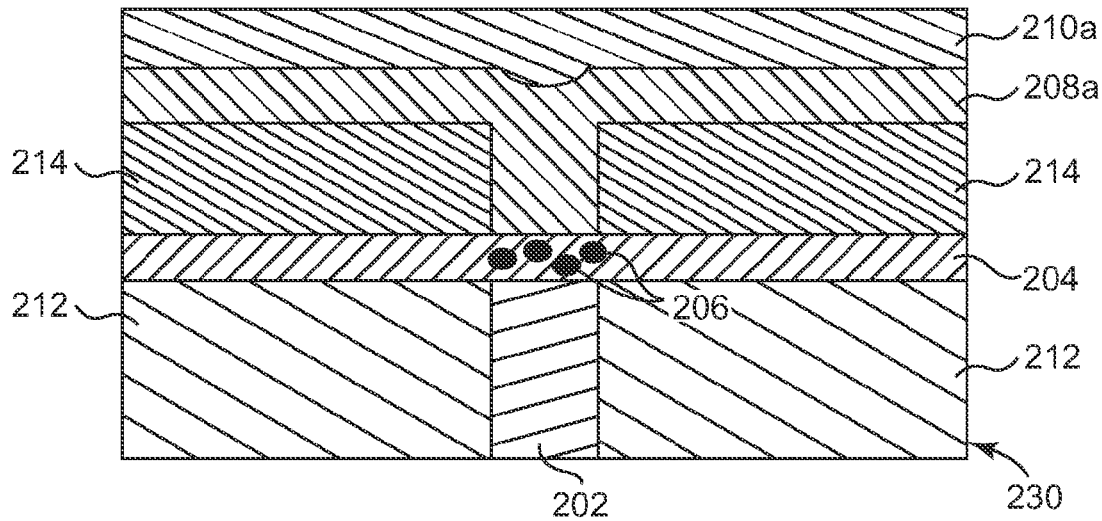
FIG. 9 illustrates a cross-sectional view of one embodiment of the preprocessed wafer, the first dielectric material layer including the nanocrystals, the second dielectric material layer, a phase change material layer, and an electrode material layer.

FIG. 9 illustrates a cross-sectional view of one embodiment of preprocessed wafer 230, first dielectric material layer 204 including nanocrystals 206, second dielectric material layer 214, a phase change material layer 208a, and an electrode material layer 210a. A phase change material, such as a chalcogenide compound material or other suitable phase change material is deposited into opening 232 and over exposed portions of first dielectric material layer 204 and second dielectric material layer 214 to provide phase change material layer 208a. Phase change material layer 208a is deposited using CVD, HDP-CVD, ALD, MOCVD, PVD, JVD, or other suitable deposition technique.

An electrode material, such as TiN, TaN, W, Al, Ti, Ta, TiSiN, TaSiN, TiAlN, TaAlN, Cu, WN, C, or suitable electrode material is deposited over phase change material layer 208a to provide electrode material layer 210a. Electrode material layer 210a is deposited using CVD, HDP-CVD, ALD, MOCVD, PVD, JVD, or other suitable deposition technique.

Figure 10:
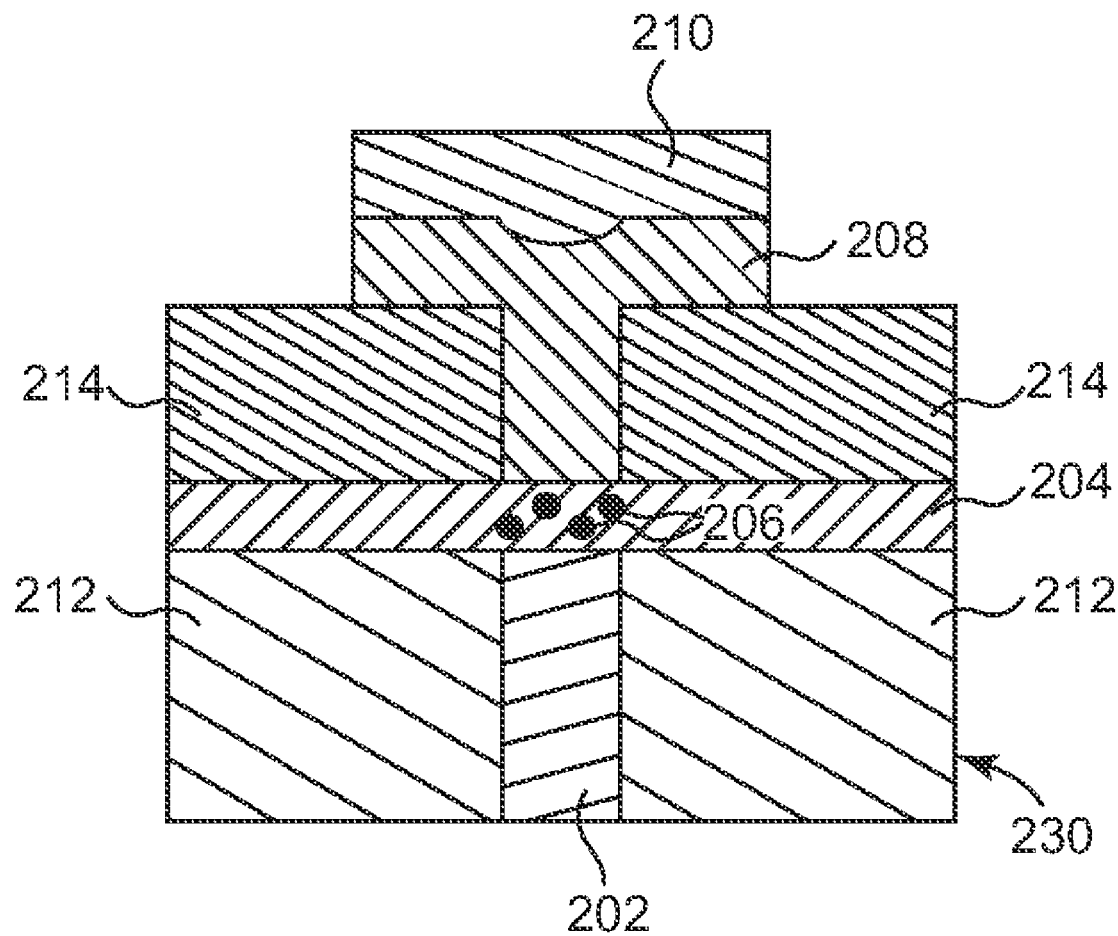
FIG. 10 illustrates a cross-sectional view of one embodiment of the preprocessed wafer, the first dielectric material layer including the nanocrystals, the second dielectric material layer, phase change material, and a top electrode.

FIG. 10 illustrates a cross-sectional view of one embodiment of preprocessed wafer 230, first dielectric material layer 204 including nanocrystals 206, second dielectric material layer 214, phase change material 208, and a top electrode 210. Electrode material layer 210a and phase change material layer 208a are etched to expose a portion of dielectric material layer 214 and to provide top electrode 210 and phase change material 208. In one embodiment, top electrode 210 and phase change material 208 are substantially centered above bottom electrode 202.

A dielectric material, such as SiO$_2$, SiO$_x$, SiN, FSG, BPSG, BSG, or other suitable dielectric material is deposited over exposed portions of top electrode 210, phase change material 208, and second dielectric material layer 214. The dielectric material layer is deposited using CVD, HDP-CVD, ALD, MOCVD, PVD, JVD, or other suitable deposition technique. The dielectric material layer is then planarized to expose top electrode 210 and to provide dielectric material 216 and phase change element 200a as previously described and illustrated with reference to FIG. 3A. The dielectric material layer is planarized using chemical mechanical planarization (CMP) or another suitable planarization technique. Upper metallization layers are then fabricated, including bit lines 112 coupled to top electrodes 210.

In another embodiment, to fabricate phase change element 200c previously described and illustrated with reference to FIG. 3C, second dielectric material layer 214 is removed after forming nanocrystals 206 as illustrated in FIG. 8. With second dielectric material layer 214 removed, a phase change material, such as a chalcogenide compound material or other suitable phase change material is deposited over first dielectric material layer 204 to provide a phase change material layer. The phase change material layer is deposited using CVD, HDP-CVD, ALD, MOCVD, PVD, JVD, or other suitable deposition technique.

An electrode material, such as TiN, TaN, W, Al, Ti, Ta, TiSiN, TaSiN, TiAlN, TaAlN, Cu, WN, C, or suitable electrode material is deposited over the phase change material layer to provide an electrode material layer. The electrode material layer is deposited using CVD, HDP-CVD, ALD, MOCVD, PVD, JVD, or other suitable deposition technique. The electrode material layer and the phase change material layer are then etched to expose portions of first dielectric material layer 204 and to provide phase change material 208 and top electrode 210 as illustrated in FIG. 3C. In one embodiment, top electrode 210 and phase change material 208 are substantially centered above bottom electrode 202.

A dielectric material, such as SiO$_2$, SiO$_x$, SiN, FSG, BPSG, BSG, or other suitable dielectric material is deposited over exposed portions of top electrode 210, phase change material 208, and first dielectric material layer 204. The dielectric material layer is deposited using CVD, HDP-CVD, ALD, MOCVD, PVD, JVD, or other suitable deposition technique. The dielectric material layer is then planarized to expose top electrode 210 and to provide dielectric material 216 and phase change element 200c as previously described and illustrated with reference to FIG. 3C. The dielectric material layer is planarized using CMP or another suitable planarization technique. Upper metallization layers are then fabricated, including bit lines 112 coupled to top electrodes 210.

The following FIGS. 11-15 illustrate embodiments for fabricating a phase change element, such as phase change element 200b previously described and illustrated with reference to FIG. 3B. The fabrication processes begins as previously described and illustrated with reference to FIGS. 4 and 5.

Figure 11:
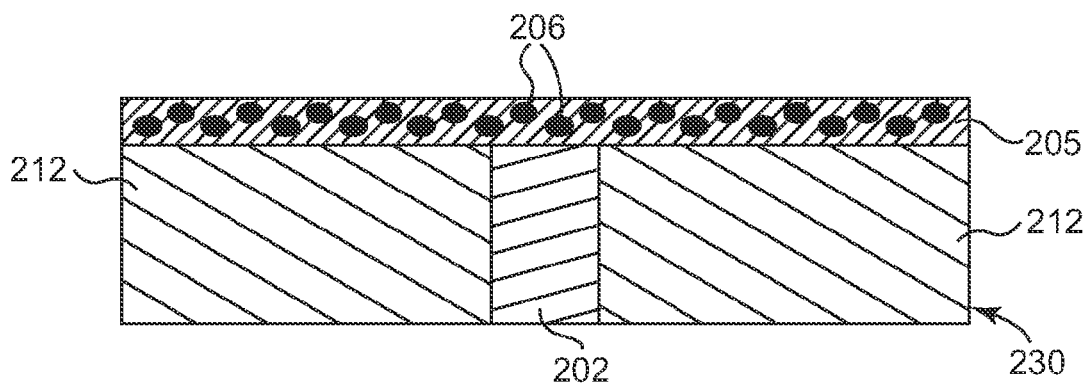
FIG. 11 illustrates a cross-sectional view of one embodiment of the preprocessed wafer and the first dielectric material layer after forming nanocrystals in the first dielectric material layer.

FIG. 11 illustrates a cross-sectional view of one embodiment of preprocessed wafer 230 and first dielectric material layer 205 after forming nanocrystals 206 in first dielectric material layer 204a. In one embodiment, nanocrystals 206, such as Si, Ge, or other suitable nanocrystals are grown in first dielectric material layer 204a. In another embodiment, nanocrystals 206, such as Si+, Ge+, or other suitable nanocrystals are implanted into first dielectric material layer 204a. In one embodiment, the nanocrystals are implanted at an energy between approximately 1-20 keV, at a dose between approximately $10^{15}$-$10^{16}$ cm$^{-2}$, and followed by RTP at approximately 950° C. for approximately 30 s.

Figure 12:
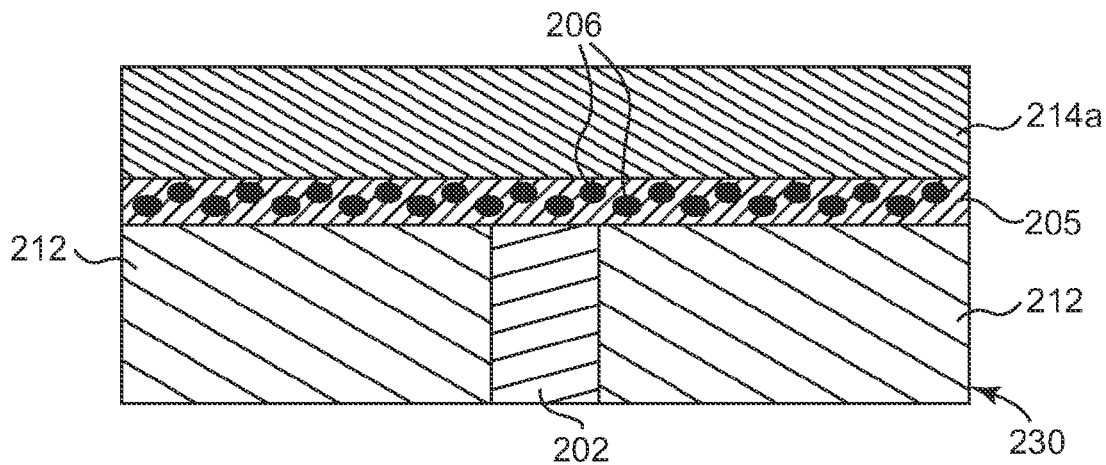
FIG. 12 illustrates a cross-sectional view of one embodiment of the preprocessed wafer, the first dielectric material layer including the nanocrystals, and a second dielectric material layer.

FIG. 12 illustrates a cross-sectional view of one embodiment of preprocessed wafer 230, first dielectric material layer 205 including nanocrystals 206, and a second dielectric material layer 214a. A dielectric material, such as SiO$_2$, SiO$_x$, SiN, FSG, BPSG, BSG, or other suitable dielectric material is deposited over first dielectric material layer 205 to provide second dielectric material layer 214a. Second dielectric material layer 214a is deposited using CVD, HDP-CVD, ALD, MOCVD, PVD, JVD, or other suitable deposition technique. In one embodiment, second dielectric material layer 214a is deposited to a thickness greater than the thickness of first dielectric material layer 205.

Figure 13:
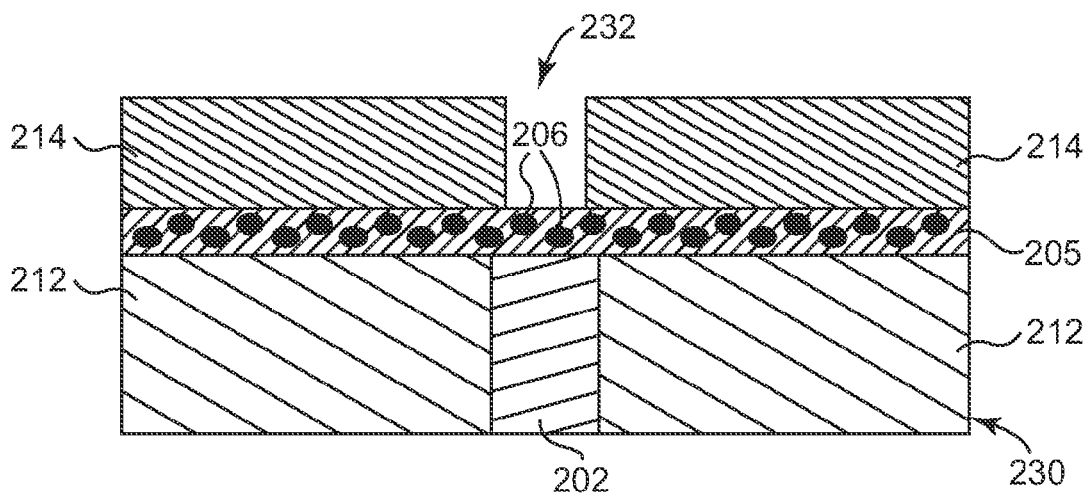
FIG. 13 illustrates a cross-sectional view of one embodiment of the preprocessed wafer, the first dielectric material layer including the nanocrystals, and the second dielectric material layer after etching the second dielectric material layer.

FIG. 13 illustrates a cross-sectional view of one embodiment of preprocessed wafer 230, first dielectric material layer 205 including nanocrystals 206, and second dielectric material layer 214 after etching second dielectric material layer 214a. Second dielectric material layer 214a is etched to provide opening 232 exposing a portion of first dielectric material layer 205. In one embodiment, opening 232 is substantially centered above bottom electrode 202.

Figure 14:
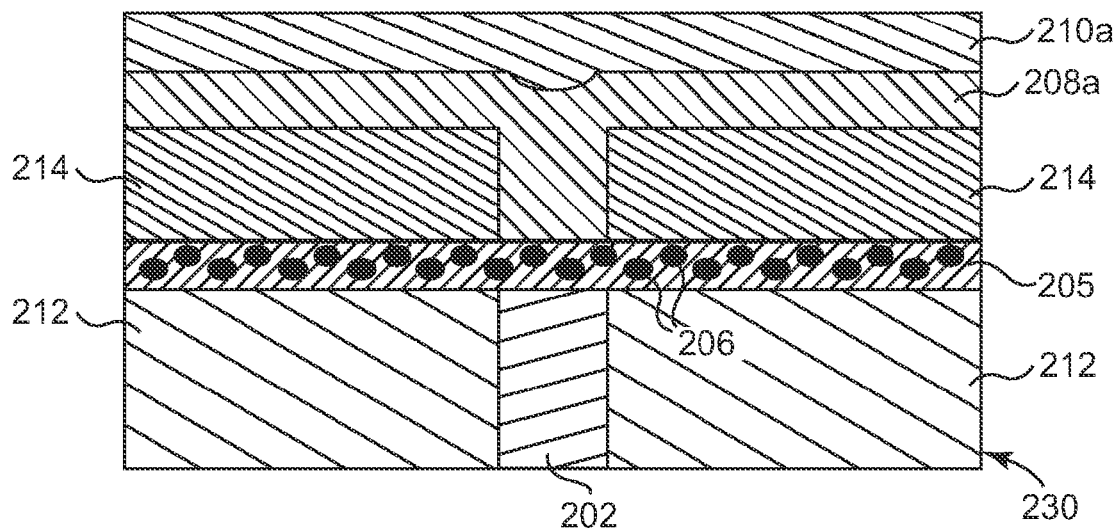
FIG. 14 illustrates a cross-sectional view of one embodiment of the preprocessed wafer, the first dielectric material layer including the nanocrystals, the second dielectric material layer, a phase change material layer, and an electrode material layer.

FIG. 14 illustrates a cross-sectional view of one embodiment of preprocessed wafer 230, first dielectric material layer 205 including nanocrystals 206, second dielectric material layer 214, a phase change material layer 208a, and an electrode material layer 210a. A phase change material, such as a chalcogenide compound material or other suitable phase change material is deposited into opening 232 and over exposed portions of first dielectric material layer 205 and second dielectric material layer 214 to provide phase change material layer 208a. Phase change material layer 208a is deposited using CVD, HDP-CVD, ALD, MOCVD, PVD, JVD, or other suitable deposition technique.

An electrode material, such as TiN, TaN, W, Al, Ti, Ta, TiSiN, TaSiN, TiAlN, TaAlN, Cu, WN, C, or suitable electrode material is deposited over phase change material layer 208a to provide electrode material layer 210a. Electrode material layer 210a is deposited using CVD, HDP-CVD, ALD, MOCVD, PVD, JVD, or other suitable deposition technique.

Figure 15:
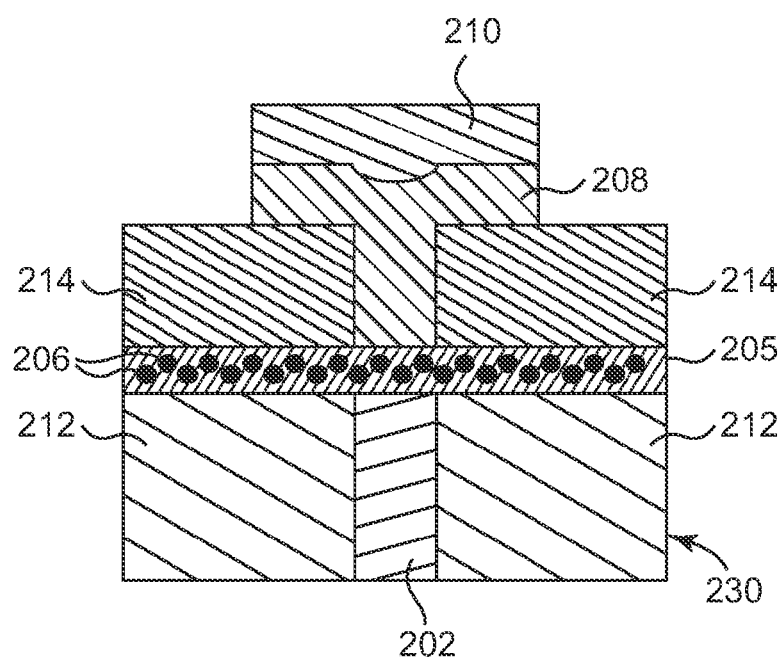
FIG. 15 illustrates a cross-sectional view of one embodiment of the preprocessed wafer, the first dielectric material layer including the nanocrystals, the second dielectric material layer, phase change material, and a top electrode.

FIG. 15 illustrates a cross-sectional view of one embodiment of preprocessed wafer 230, first dielectric material layer 205 including nanocrystals 206, second dielectric material layer 214, phase change material 208, and a top electrode 210. Electrode material layer 210a and phase change material layer 208a are etched to expose a portion of dielectric material layer 214 and to provide top electrode 210 and phase change material 208. In one embodiment, top electrode 210 and phase change material 208 are substantially centered above bottom electrode 202.

A dielectric material, such as $SiO_2$, $SiO_x$, SiN, FSG, BPSG, BSG, or other suitable dielectric material is deposited over exposed portions of top electrode 210, phase change material 208, and second dielectric material layer 214. The dielectric material layer is deposited using CVD, HDP-CVD, ALD, MOCVD, PVD, JVD, or other suitable deposition technique. The dielectric material layer is then planarized to expose top electrode 210 and to provide dielectric material 216 and phase change element 200b as previously described and illustrated with reference to FIG. 3B. The dielectric material layer is planarized using CMP or another suitable planarization technique. Upper metallization layers are then fabricated, including bit lines 112 coupled to top electrodes 210.

Embodiments of the present invention provide a phase change element including a dielectric material layer including nanocrystals. The nanocrystals ensure reproducibility of dielectric breakdown of the dielectric material layer. The dielectric breakdown of the dielectric material layer provides a nanometer range interface between the phase change material and the bottom electrode. The nanometer range interface increases the current density through the phase change material at the interface, thereby reducing the power used to program the phase change material.

While the specific embodiments described herein substantially focused on using phase change memory elements, the present invention can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
    a first electrode;
    resistivity changing material coupled to the first electrode;
    a second electrode; and
    a dielectric material layer between the resistivity changing material and the second electrode, the dielectric material layer comprising nanocrystals.

2. The integrated circuit of claim 1, wherein a current path is formed through the dielectric material layer via the nanocrystals and dielectric breakdown.

3. The integrated circuit of claim 1, wherein the first electrode, the resistivity changing material, the second electrode, and the dielectric material layer provide a via memory element.

4. The integrated circuit of claim 1, wherein the first electrode, the resistivity changing material, the second electrode, and the dielectric material layer provide a mushroom memory element.

5. The integrated circuit of claim 1, wherein the dielectric material layer comprises an oxide material.

6. The integrated circuit of claim 1, wherein the nanocrystals are located only in a portion of the dielectric material layer aligned with the resistivity changing material.

7. The integrated circuit of claim 1, wherein the resistivity changing material comprises a phase change material.

8. The integrated circuit of claim 1, wherein the resistivity changing material comprises a first portion having a first cross-sectional width and a second portion having a second cross-sectional width different from the first cross-sectional width.

9. The integrated circuit of claim 1, wherein a cross-sectional width of the dielectric material layer is greater than a cross-sectional width of the resistivity changing material.

10. A system comprising:
    a host; and
    a memory device communicatively coupled to the host, the memory device comprising:
        a first electrode;
        a dielectric material layer including nanocrystals;
        phase change material between the first electrode and the dielectric material layer; and
        a second electrode coupled to the dielectric material layer.

11. The system of claim 10, wherein the memory device further comprises a bit line coupled to the first electrode and an access device coupled to the second electrode.

12. The system of claim 10, wherein a current path is provided through the dielectric material layer via the nanocrystals and dielectric breakdown.

13. The system of claim 10, wherein the dielectric material layer has a thickness within a range of 3-15 nanometers.

14. The system of claim 10, wherein the nanocrystals are implanted in the dielectric material layer.

15. The system of claim 10, wherein the nanocrystals are grown in the dielectric material layer.

16. The system of claim 10, wherein the phase change material comprises a first portion having a first cross-sectional width and a second portion having a second cross-sectional width different from the first cross-sectional width.

17. The system of claim 10, wherein a cross-sectional width of the dielectric material layer is greater than a cross-sectional width of the phase change material.

18. A memory comprising:
a first electrode;
phase change material contacting the first electrode;
an oxide layer including nanocrystals, the oxide layer contacting the phase change material; and
a second electrode contacting the oxide layer.

19. The memory of claim 18, wherein the nanocrystals are implanted in the oxide layer.

20. The memory of claim 18, wherein the nanocrystals are grown in the oxide layer.

21. The memory of claim 18, further comprising:
a bit line coupled to the first electrode; and
an access device coupled to the second electrode.

22. The memory of claim 18, wherein the phase change material comprises a first portion having a first cross-sectional width and a second portion having a second cross-sectional width different from the first cross-sectional width.

23. The memory of claim 18, wherein a cross-sectional width of the oxide layer is greater than a cross-sectional width of the phase change material.

* * * * *